(12) United States Patent
Capulong et al.

(10) Patent No.: US 8,519,729 B2
(45) Date of Patent: Aug. 27, 2013

(54) CHUCKS FOR SUPPORTING SOLAR CELL IN HOT SPOT TESTING

(75) Inventors: Jose Francisco Capulong, Lucena (PH); Emmanuel Abas, Sta. Rosa Luguna (PH)

(73) Assignee: SunPower Corporation, San Jose, CA (US)

( * ) Notice: Subject to any disclaimer, the term of this patent is extended or adjusted under 35 U.S.C. 154(b) by 766 days.

(21) Appl. No.: 12/703,378

(22) Filed: Feb. 10, 2010

(65) Prior Publication Data
US 2011/0193561 A1 Aug. 11, 2011

(51) Int. Cl.
*G01R 31/26* (2006.01)

(52) U.S. Cl.
USPC ............ 324/761.01; 324/762.02; 324/754.01; 324/754.08; 269/20; 269/21; 279/3

(58) Field of Classification Search
USPC ............ 324/761.01–762.02, 754.01, 754.08; 269/20–21; 279/3
See application file for complete search history.

(56) References Cited

U.S. PATENT DOCUMENTS

| | | | |
|---|---|---|---|
| 4,628,991 A | 12/1986 | Hsiao | |
| 6,260,614 B1 * | 7/2001 | Guy | 165/185 |
| 6,653,550 B2 * | 11/2003 | Hayashi et al. | 136/244 |
| 7,208,971 B2 * | 4/2007 | Lee et al. | 324/750.25 |
| 8,119,902 B2 * | 2/2012 | Gibson | 136/246 |
| 8,322,300 B2 * | 12/2012 | Pavani et al. | 118/321 |
| 2002/0017916 A1 * | 2/2002 | Costello et al. | 324/760 |
| 2003/0000565 A1 * | 1/2003 | Hayashi et al. | 136/244 |
| 2004/0070404 A1 * | 4/2004 | Lee et al. | 324/545 |
| 2005/0101700 A1 * | 5/2005 | Riebel | 524/17 |
| 2007/0007986 A1 * | 1/2007 | Stadler | 324/765 |
| 2007/0295716 A1 * | 12/2007 | Quantrille et al. | 219/678 |
| 2009/0202727 A1 * | 8/2009 | Abas et al. | 427/284 |
| 2009/0202745 A1 * | 8/2009 | Pavani et al. | 427/595 |
| 2009/0238444 A1 * | 9/2009 | Su et al. | 382/149 |
| 2010/0031998 A1 * | 2/2010 | Aguglia | 136/244 |
| 2010/0327431 A1 * | 12/2010 | Touzelbaev et al. | 257/712 |
| 2011/0000261 A1 * | 1/2011 | Prabhakar et al. | 65/135.9 |
| 2012/0124529 A1 * | 5/2012 | Feng et al. | 716/54 |
| 2012/0125049 A1 * | 5/2012 | Gibson | 65/65 |

OTHER PUBLICATIONS

David et al., "Electrical and Thermal Testing and Modelling of Breakdown in Space Solar Cells and Generators", Photovoltaic Specialists Conference 1993, p. 1415-1420.*
David et al., "Electrical and Thermal Behaviour of GSR3 Type Solar Array", Photovoltaic Specialists Conference 1990, vol. 2, p. 1334-1339.*
"International Application Serial No. PCT/US2011/021460, International Search Report and Written Opinion mailed Mar. 16, 2011", 19 pgs.

* cited by examiner

*Primary Examiner* — Arleen M Vazquez
*Assistant Examiner* — LaMarr Brown
(74) *Attorney, Agent, or Firm* — Blakely Sokoloff Taylor & Zafman LLP (57) ABSTRACT

In an embodiment, a chuck to support a solar cell in hot spot testing is provided. This embodiment of the chuck comprises a base portion and a support portion disposed above the base portion. The support portion is configured to support the solar cell above the base portion and to define a space between a bottom surface of the solar cell and the base portion that thermally separates a portion of the bottom surface of the solar cell from the base portion.

21 Claims, 6 Drawing Sheets

CHUCKS FOR SUPPORTING SOLAR CELL IN HOT SPOT TESTING

FIELD

The present disclosure relates generally to semiconductor testing apparatuses. In an embodiment, the disclosure relates to chucks for supporting a solar cell in hot spot testing.

BACKGROUND

Localized heating, or "hot spots," in a solar cell can occur because of interconnection failure, cell failure, partial shading, mismatch of photo current from solar cell to solar cell, and/or partial shading. For example, when a single solar cell connected in series generates less current than other solar cells in the series, localized heating may occur because the current flowing through each solar cell in the series is not equal. Damage to, for example, a module of solar cells can occur if the localized heating of one or more solar cells become too high.

Many tests have been developed to test the ability of a solar cell to withstand hot spot heating. In these tests, a solar cell can reach a temperature of approximately 120° C., and this heat is not easily dissipated during testing. When testing a large number of solar cells, the tests need to be stopped or delayed for a certain time between each solar cell to allow a testing apparatus to cool down. However, this delay reduces the speed of the tests and therefore allows only a very limited number of solar cells to be tested at a given time.

SUMMARY

In an embodiment, a chuck to support a solar cell in hot spot testing is provided. Here, the solar cell has a top surface and a bottom surface. This chuck comprises a base portion and a support portion disposed above the base portion. The support portion is configured to support the solar cell above the base portion and to define a space, between the bottom surface of the solar cell and the base portion, that thermally separates a portion of the bottom surface of the solar cell from the base portion. It should be noted that, in this embodiment, the portion of the bottom surface that is thermally separated comprises between about 70% and about 90% of the bottom surface, which has metal conductors. However, the top surface is absent of any metal conductors. The chuck additionally comprises a bore through the base portion and the support portion. This bore is configured to allow a probe to make contact with the metal conductors through the bore. The probe is configured to apply a negative bias voltage to the solar cell.

In another embodiment, a hot spot testing apparatus is provided. The hot spot testing apparatus comprises a thermal imaging camera configured to detect heat distribution over a top surface of a solar cell, where the top surface is absent of any metal conductors. Additionally included is a chuck disposed below the thermal imaging camera. The chuck comprises a base portion and a support portion configured to support the solar cell above the base portion and configured to define a space, between a bottom surface of the solar cell and the base portion, that thermally separates a portion of the bottom surface of the solar cell from the base portion. Here, the bottom surface has metal conductors. The chuck further comprises a bore through at least the base portion and additionally comprises a probe disposed below the chuck. This probe is configured to make contact with the metal conductors through the bore and to apply a negative bias voltage to the solar cell.

In yet another embodiment, a chuck to support a solar cell in hot spot testing is provided. This embodiment of the chuck comprises a base portion and a support portion disposed above the base portion. The support portion is configured to support the solar cell above the base portion and to define a space, between a bottom surface of the solar cell and the base portion, that thermally separates a portion of the bottom surface of the solar cell from the base portion.

In one other embodiment, a method of hot spot testing a solar cell, which has a top surface and a bottom surface, is provided. In this method, the solar cell is transported over a chuck. This chuck comprises a base portion and a support portion disposed above the base portion. The support portion is configured to support the solar cell above the base portion and configured to define a space, between the bottom surface of the solar cell and the base portion, that thermally separates a portion of the bottom surface of the solar cell from the base portion. In this embodiment, the portion of the bottom surface that is thermally separated comprises between about 70% and about 90% of the bottom surface. Here, the bottom surface of the solar cell has metal conductors while the top surface is absent of any metal conductors. The chuck further comprises a bore through the base portion and the support portion, a side portion, and a vacuum tunnel having openings at two ends, where one of the openings is located within substantially a same region of the bore and another of the openings is located at the side portion. In this method, a vacuum suction is applied through the vacuum tunnel to hold the solar cell in place, and a negative bias voltage is applied to the solar cell through the metal conductors. A heat distribution of the top surface is detected upon application of the negative bias voltage.

BRIEF DESCRIPTION OF DRAWINGS

The present disclosure is illustrated by way of example and not limitation in the figures of the accompanying drawings, in which like references indicate similar elements and in which.

DETAILED DESCRIPTION

The following description and the drawings illustrate specific embodiments of the invention sufficiently to enable those skilled in the art to practice them. Other embodiments may incorporate structural, logical, electrical, process, and other changes. Examples merely typify possible variations. Individual components and functions are optional unless explicitly required, and the sequence of operations may vary.

Portions and features of some embodiments may be included in or substituted for those of others. Embodiments of the invention set forth in the claims encompass all available equivalents of those claims. Embodiments of the invention may be referred to, individually or collectively, herein by the term "invention" merely for convenience and without intending to limit the scope of this application to any single invention or inventive concept if more than one is in fact disclosed.

Figure 1:
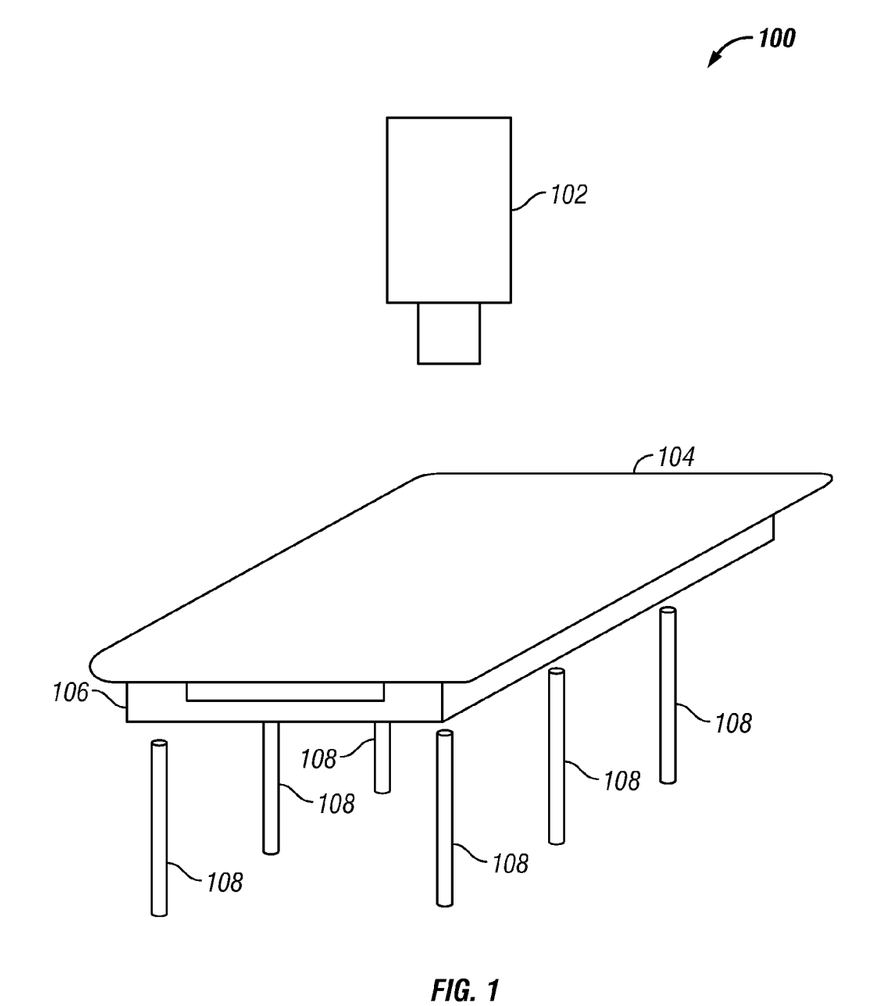
FIG. 1 depicts a hot spot testing apparatus, in accordance with an embodiment of the present invention.

FIG. 1 depicts a hot spot testing apparatus 100, in accordance with an embodiment of the present invention. The hot spot testing apparatus 100 tests an ability of the solar cell 104 to withstand hot spot heating. In this example, the hot spot testing apparatus 100 includes a thermal imaging camera 102, a solar cell 104, a chuck 106, and probes 108. The solar cell 104 is placed on top of the chuck 106, which is configured to hold or support the solar cell 104. To test the solar cell 104 for hot spots, the probes 108 disposed below the chuck 106 are configured to make contact with metal conductors located on the bottom of the solar cell 104 and apply a negative bias voltage. As explained in more detail below, the chuck 106 may include bores (not shown) from which the probes 108 pass through in order to make contact with the metal conductors.

Figure 2:
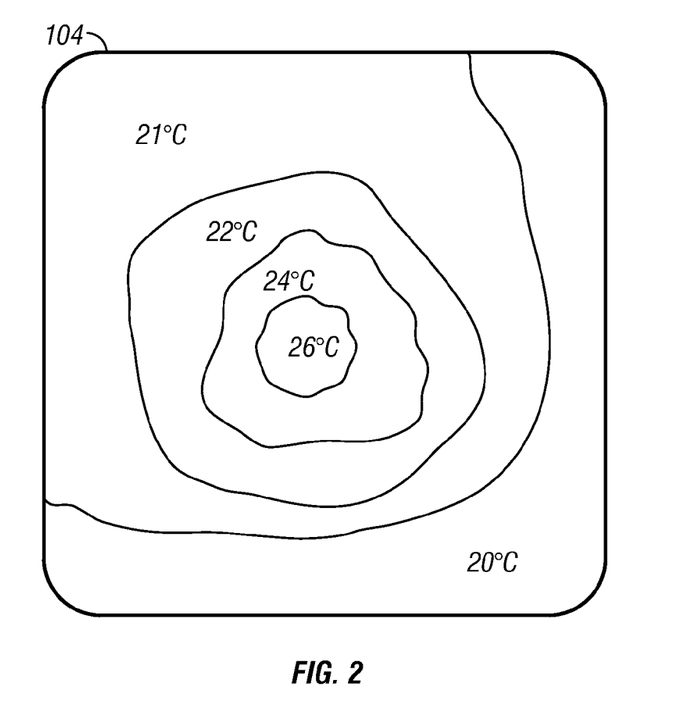
FIG. 2 depicts a thermal image of a top surface of the solar cell during hot spot testing.

With the application of the negative bias voltage, the solar cell 104 becomes, for example, short-circuited and dissipates power in the form of heat. The thermal imaging camera 102, which is disposed above the solar cell 104, can detect this heat distribution over a surface of the solar cell 104. For example, FIG. 2 depicts a thermal image of a top surface of the solar cell 104 during hot spot testing. As depicted, the application of the negative bias voltage generates localized heating of the solar cell 104 where regions of the solar cell 104 are heated to different temperatures that range from, for example, 20° C. to 26° C. From the thermal image detected by the thermal imaging camera 102, depicted in FIG. 1, the ability of the solar cell 104 to withstand hot spot heating can be identified.

Figure 3:
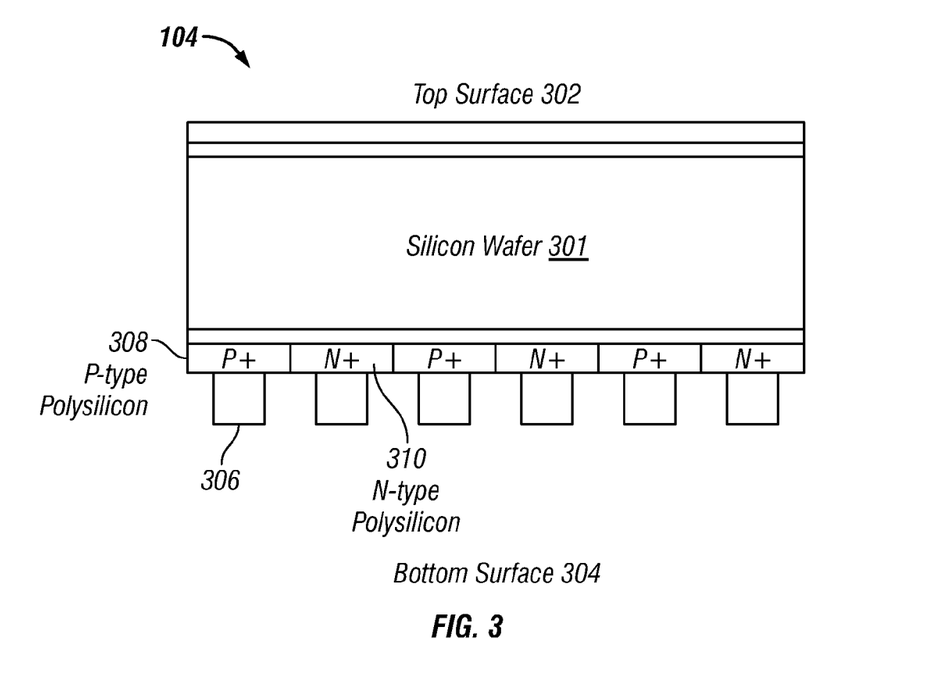
FIG. 3 depicts a diagram of a cross-sectional view of an example of a solar cell.

FIG. 3 depicts a diagram of a cross-sectional view of an example of a solar cell 104. The solar cell 104 employs a silicon wafer 301 having a top surface 302 configured to face the sun to receive solar radiation and a bottom surface 304 where metal conductors 306 to the solar cell 104 are formed. The solar cell 104 includes p-type polysilicon regions 308 and n-type polysilicon regions 310 formed in a polysilicon layer on the bottom surface 304 of the solar cell 104. The bottom surface polysilicon layer may be doped to have the p-type polysilicon regions 308 and n-type polysilicon regions 310, with each adjacent p-type polysilicon region 308 and n-type polysilicon region 310 forming a p-n junction. Metal conductors 306 are connected to the p-type polysilicon regions 308 and n-type polysilicon regions 310 to allow external circuits and devices to receive electrical power from the solar cell 104, or alternatively, to allow external circuits and devices to deliver electrical power to the solar cell 104 in hot spot testing. Given that the polysilicon layer is formed on the bottom surface 304 of the solar cell 104, the top surface 302 is absent of any metal conductors, as depicted in FIG. 3.

Figure 4A:
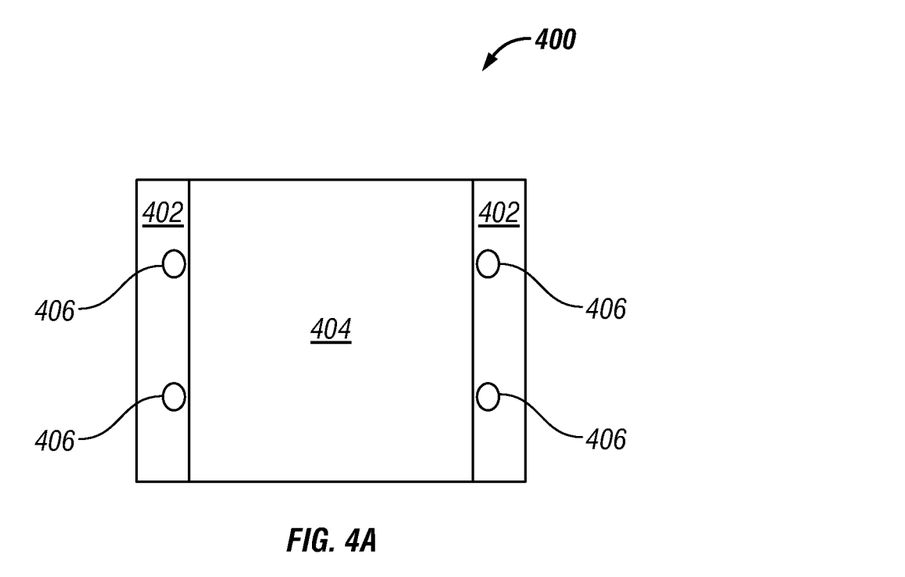
FIGS. 4A and 4B depict different views of a chuck, in accordance with an embodiment of the present invention, configured to support a solar cell in a hot spot testing apparatus.
Figure 4B:
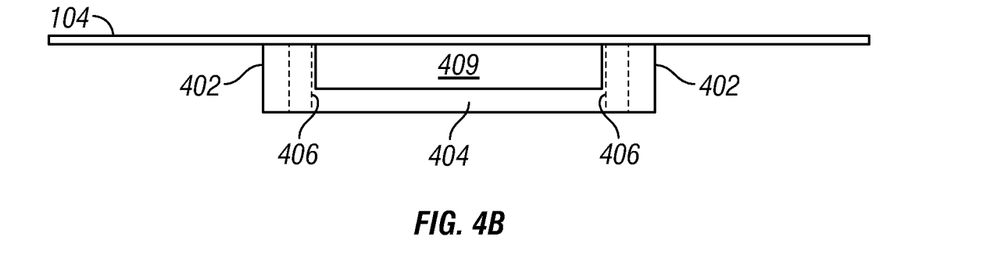

FIGS. 4A and 4B depict different views of a chuck 400, in accordance with an embodiment of the present invention, configured to support a solar cell 104 in a hot spot testing apparatus, such as the hot spot testing apparatus 100 depicted in FIG. 1. In particular, FIG. 4A depicts a top view of the chuck 400 while FIG. 4B depicts a side view of the chuck 400 in support of a solar cell 104. In this embodiment, the chuck 400, as depicted, is rectangular in shape, but it should be appreciated that in other embodiments, the chuck 400 may be formed in a variety of other shapes, such as squares, triangles, ovals, and circles. The chuck 400 includes a base portion 404 and support portions 402 that, as depicted in FIG. 4B, are disposed above the base portion 404. The chuck 400 additionally includes bores 406 through the base portion 404 and the support portions 402.

The support portions 402 are configured to support the solar cell 104 above the base portion 404. As depicted in FIG. 4A, the support portions 402 are shaped as rectangles, but may be any suitable shape and/or size such as, for example, squares, ovals, cylinders, and triangles. It should be noted that in hot spot testing, heat generated from the solar cell 104 is transferred to the chuck 400. To possibly reduce the amount of heat transferred to the chuck 400, the surface area of contact between the bottom surface (such as bottom surface 304 of FIG. 3) of the solar cell 104 and the chuck 400 can be minimalized by supporting the solar cell 104 with the support portions 402 rather than the entire surface of the chuck 400.

Additionally, the support portions 402 define a space 409, as depicted in FIG. 4B, between the bottom surface of the solar cell 104 and the base portion 404. That is, the elevation of the solar cell 104 above the base portion 404 of the chuck 400 creates a space 409. This space 409 may, in one embodiment, be greater than or equal to about 0.5 millimeters. In another embodiment, the space 409 may be greater than or equal to about 1.5 millimeters. As used herein, the term "about" means that the specified dimension or parameter may be varied within an acceptable tolerance for a given design or application. In some embodiments, for example, an acceptable tolerance for a parameter is ±10%. It should be noted that this space 409 serves to thermally separate a portion of the bottom surface of the solar cell 104 from the base portion 404. As used herein, "thermal separation" refers to a temperature division between two or more areas at different temperatures. In effect, the space 409 serves as insulation between the base portion 404 and the bottom surface of the solar cell 104. The space may reduce the amount of heat transferred from the base portion 404 of the chuck 400 to the solar cell 104. For example, thermal separation can be defined in terms of thermal conductivity of a material, liquid, or gas that, as discussed above, thermally separates the base portion 404 from the bottom surface of the solar cell 104. In one example, the thermal conductivity of air is about 0.025 W/(m*K).

Still referring to FIGS. 4A and 4B, the bores 406 are holes through, for example, the base portion 404 and the support portions 402. As discussed above, the example of the solar cell 104 depicted in FIG. 4B has a bottom surface where metal conductors are formed. In hot spot testing, probes apply negative voltage to the solar cell 104 through the metal conductors. The bores 406 allow such probes to pass through in order to make contact with the metal conductors.

Figure 5A:
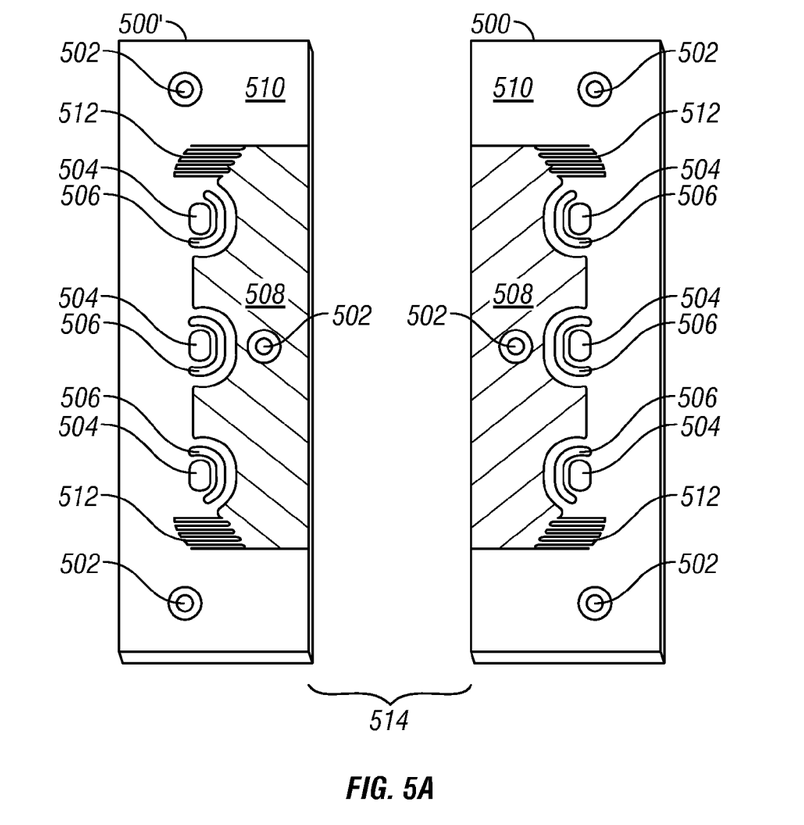
FIGS. 5A, 5B, 5C, and 5D depict various views of one or more chucks, in accordance with an alternate embodiment of the present invention, configured to support a solar cell in a hot spot testing apparatus.
Figure 5B:
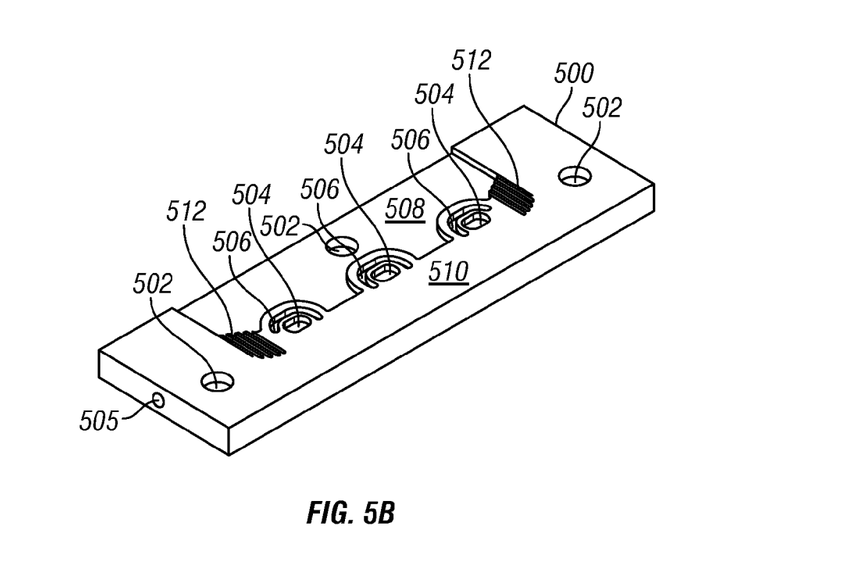

FIGS. 5A and 5B depict various views of chucks 500 and 500', in accordance with an alternate embodiment of the present invention, configured to support a solar cell in a hot spot testing apparatus, such as the hot spot testing apparatus 100 depicted in FIG. 1. As depicted in FIGS. 5A and 5B, the chucks 500 and 500' are configured to support or hold a solar cell (not shown) in hot spot testing and are separated by a channel 514. FIG. 5A depicts a top view of the chucks 500 and 500' while FIG. 5B depicts a side view of one chuck 500. In this alternate embodiment, each chuck 500 or 500' includes a base portion 508 (as illustrated with a hatched pattern in FIG. 5A) and a support portion 510 that is disposed above the base portion 508. Additionally, each chuck 500 or 500' includes bores 504, mounting holes 502, vacuum tunnel openings 505 and 506, and straight channels 512. The bores 504, as discussed above, are configured to allow probes to make contact with the metal conductors formed on the bottom surface of a solar cell. The mounting holes 502 are used to secure the chucks 500 and 500' to, for example, a table included in a hot spot testing apparatus. The chucks 500 and 500' may be secured with screws, bolts, or other fasteners.

The support portion 510 is configured to support the solar cell above the base portion 508 and to define a space between the bottom surface of the solar cell and the base portion 508. In the embodiment depicted in FIG. 5A, the portion of the bottom surface of the solar cell that is thermally separated comprises between about 70% and about 90% of the bottom surface. In other words, about 10% to about 30% of the bottom surface is supported by the support portion 510. In one embodiment, at least about 26% of the bottom surface of a 150 mm×150 mm solar cell is supported by the two chucks 500 and 500' depicted in FIG. 5A. As a result of the thermal separation created by the space between the bottom surface of the solar cell and base portion 508, the amount of heat transferred from the solar cell to the chucks 500 and 500' may be reduced to between about 0.020 W/(m*K) and 0.030 W/(m*K).

In addition to supporting the solar cell, the chucks 500 and 500' also hold the solar cell in place during hot spot testing. In one example, the solar cell can be held in place with the use of vacuum suction. The vacuum can be applied through vacuum tunnels to force the bottom surface of the solar cell to adhere to a surface of the support portion 510. Each vacuum tunnel has at least two openings 505 and 506. As depicted in FIG. 5B, each chuck 500 or 500' includes at least one side, and in one embodiment, one vacuum tunnel opening 505 can be located at the side. The other vacuum tunnel openings 506 may be located on a surface of the support portion 510.

Figure 5C:
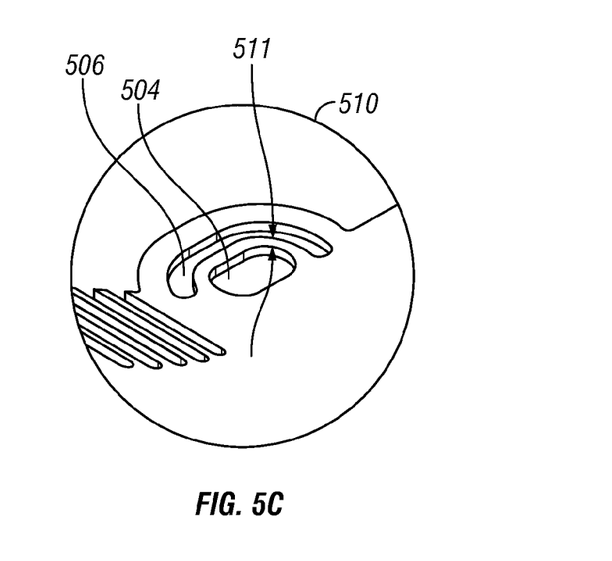

FIG. 5C depicts a magnified view of a support portion 510 having a vacuum tunnel opening 506 located near a bore 504. In one embodiment, each vacuum tunnel opening 506 located at the surface of the support portion 510 can be located within substantially the same region of the bore 504. As used herein, the term "substantially" means that the specified dimension may extend within an acceptable tolerance for a given application. This dimension may depend on the geometry or shape of the vacuum tunnel opening 506 and/or the bore 504, the force of the applied vacuum, and/or the force applied by probes when in contact with the solar cell. In one embodiment, a distance 511 or dimension between a vacuum tunnel opening 506 and a bore 504 may range from about 1 millimeter to about 2 millimeters. For example, the distance 511 may be about 1.9 millimeters. In the embodiment depicted in FIG. 5C, the vacuum tunnel openings 506 are located substantially within the same region of the bores 504 to possibly reduce, for example, the sheer force applied to a cell solar cell resulting from the vacuum force and an opposite force applied by probes when in contact with the bottom surface of the solar cell. As depicted in FIGS. 5A-5C, each vacuum tunnel opening 505 or 506 is circular or crescent in shape, but it should be appreciated that in other embodiments, the vacuum tunnel openings 505 or 506 may be formed in a variety of other shapes, such as rectangles and ovals.

Figure 5D:
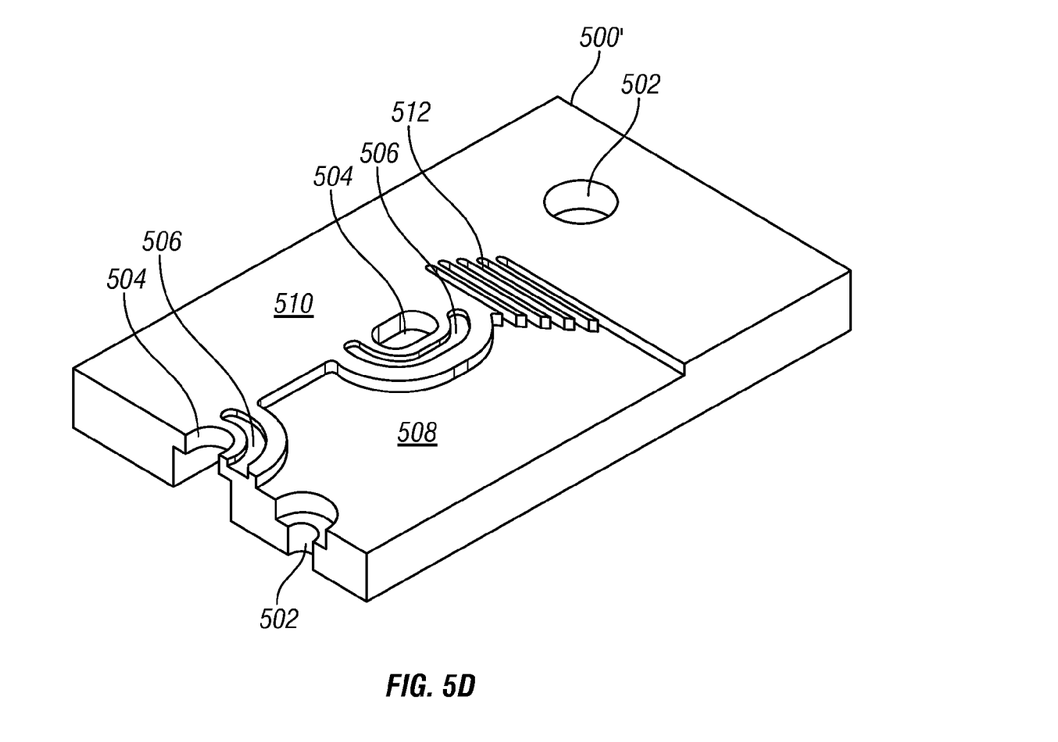

The support portions of the chucks 500 and 500' also include a number of straight channels 512, and FIG. 5D depicts a magnified view of these straight channels 512. Each solar cell has a corner, and a number of these straight channels 512 are configured to contact a portion of the corner. Given that each channel of the straight channels 512 is separated from the other channels by a space, the straight channels 512 are configured to reduce surface contact of the support portion 510 with the corner of the solar cell. In one example, the straight channels 512 may be located within the vicinity of corners of the solar cell to accommodate the different sizes of the solar cells, such as 150 mm×150 mm, 125.50 mm×125.50 mm, and other sizes. For example, a corner of a large solar cell is in contact with a larger number of straight channels 512 when held in place by a chuck compared to a smaller solar cell.

It should be appreciated that the chucks 500 and 500' may be comprised of a variety of different materials. In one embodiment, heat transfer may be further reduced with the use of plastic polymers. Examples of plastic polymers include polyether ether ketone (PEEK), GAROLITE, MC NYLON, polyoxybenzylmethylenglycolanhydride (BAKELITE), MICROTHERM SUPER G, and other plastic polymers. In one embodiment, the plastic polymer has a thermal conductivity between about 0.250 W/(m*K) and about 0.288 W/(m*K). Examples of such plastic polymers include PEEK and GAROLITE. Additionally, the selection of the plastic polymer for the chucks 500 and 500' may be based on the tensile strength of the plastic polymer. In one embodiment, the plastic polymer may have a tensile strength between about 95 MPa and about 100 MPa. Examples of plastic polymers with tensile strengths in this range include PEEK and MC NYLON.

Figure 6:
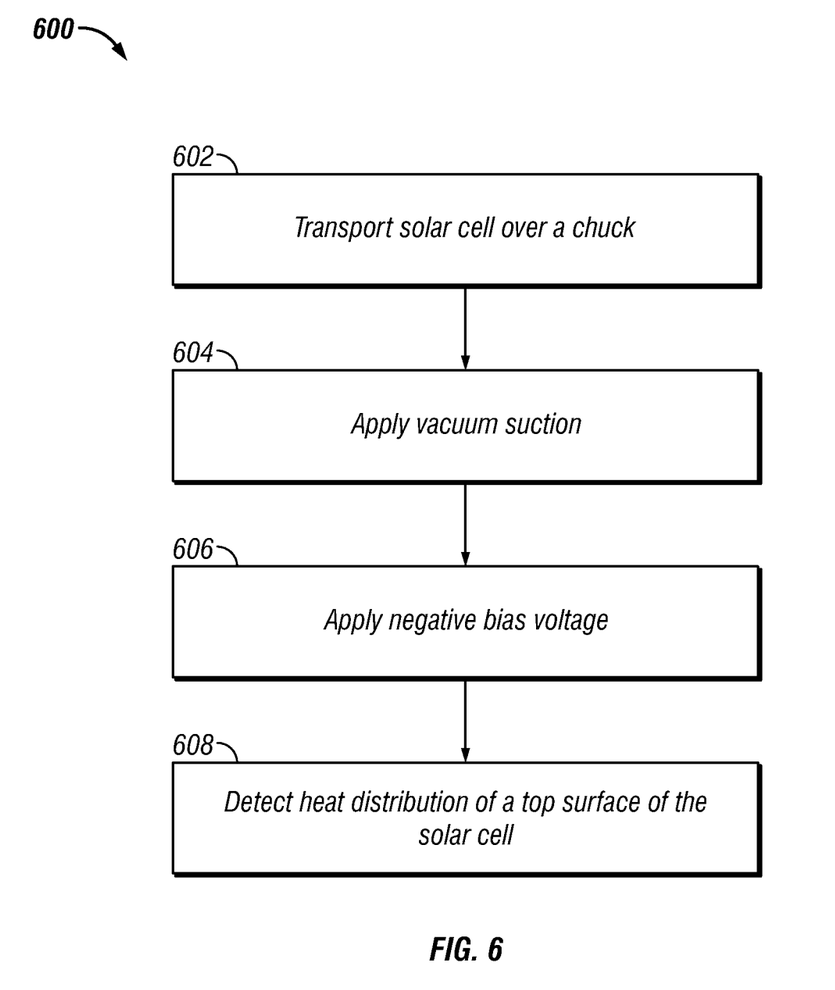
FIG. 6 depicts a flow diagram of a general overview of a method in accordance with an embodiment for hot spot testing solar cells.

FIG. 6 depicts a flow diagram of a general overview of a method 600 in accordance with an embodiment for hot spot testing solar cells. In an example embodiment, the method 600 may be implemented by the hot spot testing apparatus 100 depicted in FIG. 1. As depicted in FIG. 6, a solar cell is transported over a chuck at 602. In this example, the solar cell has a top surface and a bottom surface, where the bottom surface has metal conductors while the top surface is absent of any metal conductors. The chuck that supports the solar cell has a base portion and a support portion disposed above the base portion, as described above.

To hold the solar cell in place, vacuum suction is applied at 604 through vacuum tunnels of the chuck. With the solar cell held in place, probes may make contact with the bottom surface of the solar cell and apply, at 606, a negative bias voltage to the solar cell through the metal conductors. With the negative all bias voltage applied, regions of the solar cell are heated, and at 608, the heat distribution on the top surface of the solar cell is detected. After the heat distribution is detected, vacuum suction is stopped and the solar cell, which is heated, is transferred away from the chuck. The method 600 is then repeated for another solar cell. The use of the chuck as described above to support the solar cell may, for example, reduce the amount of heat transferred from the heated solar cell to the chuck. Thus, the chuck may not be significantly heated during hot spot testing. A subsequent solar cell can therefore be quickly transported over the chuck without the chuck transferring significant heat from a previous hot spot test. As a result, the use of the various embodiments of chucks described above in hot spot testing may, for example, facilitate the testing of a large number of solar cells for hot spots in a relatively short amount of time.

In the foregoing detailed description, various features are occasionally grouped together in a single embodiment for the purpose of streamlining the disclosure. This method of disclosure is not to be interpreted as reflecting an intention that the claimed embodiments of the subject matter require more features than are expressly recited in each claim. Rather, as the following claims reflect, the invention may lie in less than all features of a single disclosed embodiment. Thus the following claims are hereby incorporated into the detailed description, with each claim standing on its own as a separate preferred embodiment.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the invention(s). In general, structures and functionality presented as separate components in the exemplary configurations may be implemented as a combined structure or component. Similarly, structures and functionality presented as a single component may be implemented as separate components. These and other variations, modifications, additions, and improvements fall within the scope of the invention(s).

What is claimed is:

1. A chuck to support a solar cell having a top surface and a bottom surface in hot spot testing, the chuck comprising:
   a base portion;
   a support portion disposed above, and coupled to, the base portion, the support portion to support the solar cell above the base portion and to define a space between the bottom surface of the solar cell and the base portion that thermally separates a portion of the bottom surface of the solar cell from the base portion, the portion of the bottom surface being thermally separated comprising between about 70% and about 90% of the bottom surface, the bottom surface having metal conductors, and the top surface being absent of any metal conductors; and
   a bore through the base portion and the support portion, the bore to allow a probe to make contact with the metal conductors through the bore, the probe being to apply a negative bias voltage to the solar cell.

2. The chuck of claim 1, wherein the chuck is heated during the hot spot testing, and wherein the space reduces an amount of heat transferred from the base portion of the chuck to the solar cell.

3. The chuck of claim 2, wherein the amount of heat transferred is reduced to between about 0.020 W/(m*K) and 0.030 W/(m*K).

4. The chuck of claim 1, wherein a portion of the support portion comprises straight channels, and wherein a number of the straight channels is to contact a corner of the solar cell and to reduce surface contact of the support portion with the corner.

5. The chuck of claim 1, wherein the chuck comprises a vacuum tunnel having openings at two ends, one of the openings being located within substantially a same region of the bore and another of the openings being located at a side of the chuck.

6. The chuck of claim 1, wherein the chuck is comprised of a plastic polymer.

7. The chuck of claim 6, wherein the plastic polymer has a thermal conductivity between about 0.250 W/(m*k) and about 0.288 W/(m*k).

8. The chuck of claim 6, wherein the plastic polymer has a tensile strength between about 95 MPa and about 100 MPa.

9. A hot spot testing apparatus, comprising:
   a thermal imaging camera to detect heat distribution over a top surface of a solar cell, the top surface being absent any metal conductors;
   a chuck disposed below the thermal imaging camera, the chuck comprising a base portion and a support portion coupled to the base portion, the support portion to support the solar cell above the base portion and to define a space between a bottom surface of the solar cell and the base portion that thermally separates a portion of the bottom surface of the solar cell from the base portion, the bottom surface having the metal conductors, and the chuck further having a bore through at least the base portion; and
   a probe disposed below the chuck, the probe to make contact with the metal conductors through the bore and to apply a negative bias voltage to the solar cell.

10. The hot spot testing apparatus of claim 9, further comprising an additional chuck disposed below the thermal imaging camera, the additional chuck comprising an additional base portion and an additional support portion to support the solar cell above the additional base portion and to define an additional space, between the bottom surface of the solar cell and the additional base portion, that thermally separates an additional portion of the bottom surface of the solar cell from the additional base portion.

11. The hot spot testing apparatus of claim 10, wherein the chuck is separated from the additional chuck by a channel.

12. The hot spot testing apparatus of claim 10, wherein at least about 26% of the bottom surface of the solar cell is supported by the support portion and the additional support portion.

13. A chuck to support a solar cell in hot spot testing, the chuck comprising:
   a base portion; and
   a support portion disposed above, and coupled to, the base portion, the support portion to support the solar cell above the base portion and to define a space between a bottom surface of the solar cell and the base portion that thermally separates a portion of the bottom surface of the solar cell from the base portion.

14. The chuck of claim 13, wherein a portion of the support portion comprises straight channels, and wherein a number of the straight channels is to contact a corner of the solar cell.

15. The chuck of claim 13, wherein the chuck has a bore through at least the base portion, and wherein the bore is to allow a probe to make contact with the bottom surface of the solar cell through the bore.

16. The chuck of claim 15, wherein the support portion comprises a surface to contact a different portion of the bottom surface of the solar cell, wherein the chuck further comprises a side portion, and wherein the chuck comprises a vacuum tunnel having openings at two ends, one of the openings being located within substantially a same region of the bore, another of the openings being located at the side portion.

17. The chuck of claim 13, wherein the chuck is comprised of a plastic polymer.

18. The chuck of claim 17, wherein the plastic polymer has a thermal conductivity between about 0.250 W/(m*K) and about 0.288 W/(m*K).

19. The chuck of claim 17, wherein the plastic polymer has a tensile strength between about 95 MPa and about 100 MPa.

20. The chuck of claim 13, wherein the portion of the bottom surface of the solar cell that is thermally separated comprises between about 70% to about 90% of the bottom surface.

21. A method of hot spot testing a solar cell having a top surface and a bottom surface, the method comprising:
   transporting the solar cell over a chuck, the chuck comprising:
      a base portion,
      a support portion disposed above, and coupled to, the base portion, the support portion to support the solar cell above the base portion and to define a space between the bottom surface of the solar cell and the base portion that thermally separates a portion of the bottom surface of the solar cell from the base portion, the portion of the bottom surface being thermally separated comprising between about 70% and about 90% of the bottom surface, the bottom surface having metal conductors, and the top surface being absent of any metal conductors,
a bore through the base portion and the support portion, a side portion, and
a vacuum tunnel having openings at two ends, one of the openings being located within substantially a same region of the bore and another of the openings being located at the side portion;

applying a vacuum suction through the vacuum tunnel to hold the solar cell in place;

applying a negative bias voltage to the solar cell through the metal conductors; and detecting a heat distribution of the top surface upon application of the negative bias voltage.

* * * * *